US007480151B2

United States Patent
Miura (10) Patent No.: US 7,480,151 B2
(45) Date of Patent: Jan. 20, 2009

(54) WIRING BOARD AND METHOD OF MANUFACTURING THE SAME

(75) Inventor: Yoichi Miura, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 12/000,173

(22) Filed: Dec. 10, 2007

(65) Prior Publication Data

US 2008/0106880 A1    May 8, 2008

Related U.S. Application Data

(62) Division of application No. 10/527,169, filed as application No. PCT/JP2004/004908 on Apr. 5, 2004, now Pat. No. 7,325,301.

(30) Foreign Application Priority Data

Apr. 9, 2003    (JP)    ............... 2003-105794

(51) Int. Cl.
  *H05K 7/00*    (2006.01)
(52) U.S. Cl. .................. 361/783; 361/760; 361/761; 361/767; 361/768; 174/263
(58) Field of Classification Search ............. 361/760, 361/761, 767, 768; 174/261, 263
See application file for complete search history.

(56) References Cited

U.S. PATENT DOCUMENTS

| 5,738,931 | A | * | 4/1998 | Sato et al. ........... 428/209 |
| 6,351,031 | B1 | * | 2/2002 | Iijima et al. ......... 257/698 |
| 6,555,758 | B1 | * | 4/2003 | Stelzl et al. ......... 174/260 |
| 6,678,952 | B2 | | 1/2004 | Jamil |
| 6,797,367 | B2 | * | 9/2004 | Ogawa et al. ........ 428/209 |
| 7,174,630 | B2 | | 2/2007 | Hsu et al. |
| 7,288,729 | B2 | * | 10/2007 | Imamura et al. ..... 174/534 |
| 2001/0040290 | A1 | * | 11/2001 | Sakurai et al. ....... 257/737 |

(Continued)

FOREIGN PATENT DOCUMENTS

JP    59--208756    11/1984

(Continued)

*Primary Examiner*—Tuan T Dinh
*Assistant Examiner*—Hoa C Nguyen
(74) *Attorney, Agent, or Firm*—Oliff & Berridge, PLC (57) ABSTRACT

A wiring board according to the present invention includes a wiring part formed of one or more layers, a first terminal area disposed on one side of the wiring part in a projecting manner, and a second terminal area disposed on the other side of the wiring part. A resist having an opening for a first terminal area is formed on a surface of a composite made of a plurality of metal layers. A part of a first metal layer of the composite is etched through the opening for a first terminal area to form a hole. The hole is subjected to an electroless plating through the opening of the resist. Thus, the hole is filled with an electroplated layer to form a first terminal area. Then, the resist is removed from the composite, and a wiring layer is formed thereon. Subsequently, a solder resist having an opening for a second terminal area is disposed on the wiring layer. The opening of a second terminal area of the solder resist is subjected to an electroplating so as to form a second terminal area. Removing remaining parts of the composite, a wiring board is completed.

3 Claims, 7 Drawing Sheets

U.S. PATENT DOCUMENTS

2002/0134582 A1* 9/2002 Celaya et al. ............... 174/261
2007/0175025 A1* 8/2007 Tsukamoto et al. ........... 29/832

FOREIGN PATENT DOCUMENTS

| JP | 3-94459 | 4/1991 |
| JP | 11-135551 | 5/1999 |
| JP | 2000-183223 | 6/2000 |

* cited by examiner

WIRING BOARD AND METHOD OF MANUFACTURING THE SAME

This is a Divisional of U.S. patent application Ser. No. 10/527,169 filed on Mar. 9, 2005, which is the U.S. National Phase of PCT/JP04/004908 filed on Apr. 5, 2004, which are hereby incorporated by reference in their entirety. This application claims priority to Japanese Patent Application No. 2003-105794 filed Apr. 9, 2003, which is hereby incorporated by reference in its entirety.

BACKGROUND OF THE INVENTION

1. Field of the Invention

The present invention relates to a wiring board having one or more wiring layers, and a method of manufacturing the same. A projecting bump for flip-chip connection is formed as a first terminal area on one side of the wiring layers. The bump is flip-chip connected to a semiconductor element. A second terminal area is formed by plating on the other side of the wiring layers, such that an opening of a solder resist covering the wiring layers is filled with the second terminal area.

2. Background Art

Recently, a semiconductor element (also referred to as "semiconductor chip" or simply as "chip") of a semiconductor device has a larger number of external terminals. A semiconductor element is operated at a high speed. Thus, in order to improve the electric properties of the semiconductor element, the semiconductor element is bonded to a board for a semiconductor package as an interposer, by means of flip-chip bonding of an area array type.

In C4-type flip-chip bonding (a type of flip-chip connection by solder bonding), it has been conventionally necessary to form solder bumps on terminals of a board, for a stable bonding to solder bumps on a semiconductor element.

Such solder bumps are generally formed on a board in the following manner. First, a solder paste is screen-printed on the board using a metal mask to supply a solder thereon, and then the solder on the board is subjected to a reflow process, a flux removal process, and a planarizing process, so that solder bumps are formed.

However, screen printing of a solder paste on a board entails the high cost of manufacturing a metal mask. In addition, pitch reduction between bumps is limited. A minimum pitch is generally considered to be about 150 μm.

In the future, a semiconductor element will have a finer wiring of about 90 nm, and thus a smaller terminal pitch may be needed. Therefore, another method alternative to screen printing is sought to form bumps at smaller pitches.

A method of forming bumps at smaller pitches by a chemical reaction is one example of a method alternative to screen printing. That is, bumps are formed on a board by a substitution reaction of metal and a metal salt. However, this method also suffers from problems such as high material and manufacturing costs, and uneven heights of the bumps.

When solder bumps formed on a board by screen printing are bonded to solder bumps on a semiconductor element, the bumps are bonded by heating and melting a solder after the bumps are brought into contact with each other. The uneven heights of the solder bumps on the board may cause insufficient bonding of the solder bumps on the board to the solder bumps on the semiconductor element.

In flip-chip bonding, where the solder bumps on the semiconductor element are not melted, but the solder bumps on the board are melted, there is a problem in that oxidized surfaces of the solder bumps on the board result in a deterioration in a wetting property thereof to the solder bumps on the semiconductor element.

A board has generally a solder resist disposed thereon, and terminals to be bonded to solder bumps on a semiconductor element. When a board is of an NSMD (Non-Solder Mask Defined) structure, the terminals on the board may be displaced from the solder resist, depending on shapes of the terminals. Further, such a board can be easily damaged by a stress caused by heat or an impact caused by dropping the board. As a result, the board may be defectively bonded to a semiconductor element because of deformations of the terminals on the board, which deteriorates a reliability of the board.

In particular, smaller bump pitches leads to a smaller diameter of an opening of a solder resist. Thus, when a board is of an SMD (Solder Mask Defined) structure, a solder must be supplied to an opening of a solder resist in order to realize a satisfactory bonding of the board to a semiconductor element.

Figure 7:
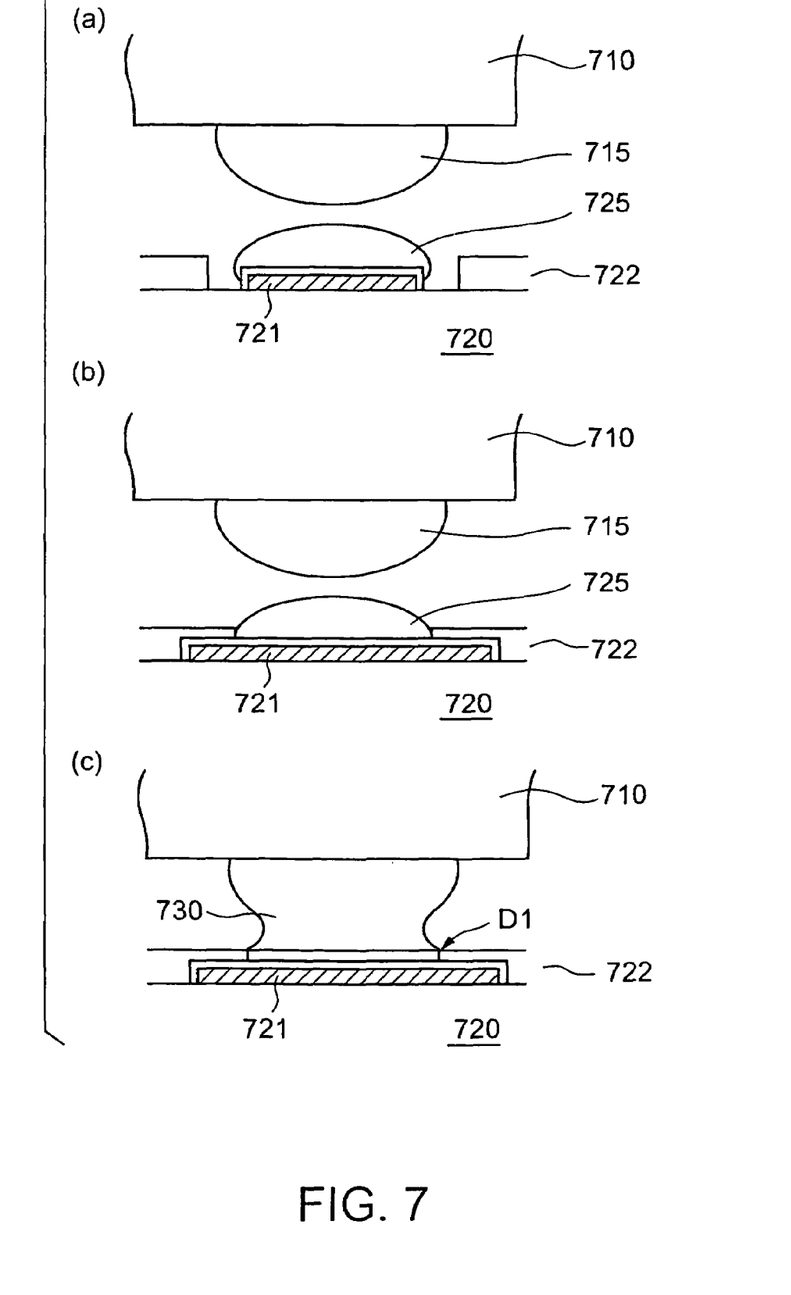

As shown in FIG. 7(a), the term "NSMD structure" herein means that a region of a terminal area 721 is not limited by a solder resist 722, while the term "SMD structure" means that a region of the terminal area 721 is limited by the solder resist 722, which is shown in FIGS. 7(b) and 7(c).

Even in the SMD structure where a solder is supplied to an opening of a solder resist, when a wall angle of the solder resist in cross-section is substantially perpendicular, stress is concentrated on an upper surface of the solder (a part indicated by D1). Thus, a duration of life of the board may be reduced, if a thermal impact is applied thereto.

On the other hand, when a wall angle of a solder resist in cross-section is obtuse, there are problems in that sizes of bottom parts of openings are not uniform depending on a thickness of a resist and a sensitivity of the resist, while sizes of surfaces of the openings cannot be enlarged when bumps are formed at smaller pitches.

Conventional methods are disclosed in Japanese Patent Laid-Open Publication Nos. 2001-93929 and 2002-203868.

As described above, in the C4-type flip-chip bonding (a type of flip-chip connection by solder bonding), solder bumps are formed on a board. Although smaller bump pitches are desired, solder bumps at such smaller pitches cannot be formed on a board by means of the conventional screen printing of a solder paste. When bumps are formed on a board by means of a substitution reaction of metal and a metal salt, there are disadvantages of high material and manufacturing costs, and uneven heights of the formed bumps. A board generally has a solder resist disposed thereon and terminals to be bonded to solder bumps on a semiconductor element. However, such a structure causes various problems, and thus measures to deal with these problems are needed.

SUMMARY OF THE INVENTION

The present invention is made to solve the above-described problems. Specifically, an object of the present invention is to provide a wiring board capable of being directly flip-chip connected to solder bumps of a semiconductor element in an assured manner, and a method of manufacturing the same.

The present invention is a method of manufacturing a wiring board including a wiring part formed of one or more wiring layers, a first terminal area disposed on one side of the wiring part in a projecting manner, and a second terminal area disposed on the other side of the wiring part, the method comprising: a resist forming step of forming a resist having an opening for a first terminal area, on a surface of a composite having a plurality of metal layers; an etching step of etching only a first metal layer of the composite to form a hole through the opening for a first terminal area of the resist; a first electroplating step of forming a first terminal area by electroplating through the opening for a first terminal area of the resist, such that the hole is filled with the first terminal area; a wiring layer forming step of forming a wiring layer by disposing a resin material layer on the first terminal area, after the resist is removed from the composite; a solder resist forming step of forming on the wiring layer a solder resist having an opening for a second terminal area; a second electroplating step of electroplating the opening for a second terminal area of the solder resist to form a second terminal area; and an etching and removing step of etching and removing remaining parts of the composite.

In the method of manufacturing a wiring board, the composite may be formed by laminating a first Cu layer, an Ni layer or a Ti layer, and a second Cu layer.

In the method of manufacturing a wiring board, the first electroplating step may include an Au plating and a Cu plating in that order; an Au plating and an Ni plating in that order; an Au plating, an Ni plating, and a Cu plating in that order; a Pd plating and a Cu plating in that order; a Pd plating and an Ni plating in that order; a Pd plating, an Ni plating, and a Cu plating in that order; a Pd alloy plating and a Cu plating in that order; a Pd alloy plating and an Ni plating in that order; a Pd alloy plating, an Ni plating, and a Cu plating or an Sn plating in that order; an Sn plating and Cu plating or an Sn alloy plating in that order; or an Sn alloy plating and a Cu plating in that order.

The present invention is a method of manufacturing a wiring board including a wiring part formed of one or more wiring layers, a first terminal area disposed on one side of the wiring part in a projecting manner, and a second terminal area disposed on the other side of the wiring part, the method comprising: a resist forming step of forming a resist having an opening for a first terminal area, on a surface of a composite having a first Cu layer, an Ni layer, and a second Cu layer; a first electroplating step of forming an electroplated portion for a first terminal area by electroplating, such that the opening for a first terminal area of the resist is filled with the electroplated portion; a wiring layer forming step of forming a wiring layer by disposing a resin material layer on the electroplated portion, after the resist is removed from the composite; a solder resist forming step of forming on the wiring layer a solder resist having an opening for a second terminal area; a second electroplating step of electroplating the opening for a second terminal area of the solder resist to form a second terminal area; an etching and removing step of etching and removing the second Cu layer of the composite, with the Ni layer being used as an etching stopper; an etching step of forming a first terminal area having the electroplated portion, the first Cu layer, and the Ni layer, by forming an additional resist on the Ni layer to cover only a region where the first terminal area is formed, and etching and removing the exposed Ni layer and the first Cu layer with the additional resist being used as an etching proof resist; and an electroless-plating step of electroless-plating, after the additional resist is removed from the first terminal area, to form an electroless Au plated layer, or an electroless Ni plated layer and an electroless Au plated layer in that order, on the electroplated portion, the first Cu layer, and the Ni layer.

In the method of manufacturing a wiring board, the composite may be made of a clad material.

In the method of manufacturing a wiring board, the wiring layer may be formed by a semi-additive method in the wiring layer forming step.

In the method of manufacturing a wiring board, the wiring layer forming step may include: (A) a laminating step of laminating a resin material layer made of an insulating resin on the composite; (B) a hole forming step of forming a hole for forming a via by means of a laser in the resin material layer laminated in the laminating step; and (C) a circuit part forming step of forming a circuit part by electroless Cu plating a surface of the resin material layer including a surface of the hole to form thereon an electroless Cu plated layer, forming on the electroless Cu plated layer a resist having an opening for forming a circuit part, electro Cu plating the electroless Cu plated layer exposed from the opening of the resist to form thereon an electro Cu plated layer with the electroless Cu plated layer being used as a conductive layer, and removing the resist from the electro Cu plated layer and etching and removing the exposed electroless Cu plated layer so as to form a via.

In the method of forming a wiring board, the wiring layer may be formed by both a full-additive method and a subtractive method, or both the full-additive method and the semi-additive method.

In the subtractive method, a wiring part is formed by selectively etching a conductive thin plate for forming a wiring layer such as a copper foil. In the full-additive method, a wiring part is formed by only selective plating. In the semi-additive method, a wiring part is formed by etching and removing a plated conductive layer. The semi-additive method also includes a method of forming a wiring part by forming a thin conducive layer for carrying current on a wiring layer by plating, selectively electroplating the wiring layer by using the thin conductive layer as a conductive layer to form a thick wiring part, and removing the thin conductive layer for carrying current by flush etching.

The present invention is a wiring board comprising: a wiring part formed of one or more wiring layers; a plurality of first terminal areas disposed on one side of the wiring part; and a plurality of second terminal areas disposed on the other side of the wiring part; wherein the wiring layer has a resin material layer facing on a side of the first terminal areas, the resin material layer being exposed because no solder resist is disposed on the wiring part on the side of the first terminal areas; the first terminal areas respectively have flat portions at their end, the flat portions being flush with each other, and a surface plated layer formed of an electroplated layer or an electroless plated layer is formed on a whole surface of the flat portion of each of the first terminal areas.

In the wiring board, the electroplated layer of each of the first terminal areas may include, from a surface, side of the electroplated layer, an Au plated layer and a Cu plated layer in that order; an Au plated layer and an Ni plated layer in that order; an Au plated layer, an Ni plated layer, and a Cu plated layer in that order; a Pd plated layer and a Cu plated layer in that order; a Pd plated layer and an Ni plated layer in that order; a Pd plated layer, an Ni plated layer, and a Cu plated layer in that order; a Pd alloy plated layer and a Cu plated layer in that order; a Pd alloy plated layer and an Ni plated layer in that order; a Pd alloy plated layer, an Ni plated layer, and a Cu plated layer or an Sn plated layer in that order; an Sn plated layer and Cu plated layer in that order; an Sn alloy plated layer or an Sn alloy plated layer and a Cu plated layer in that order.

In the wiring board, the electroless plated layer of each of the first terminal areas may include an electroless Au plated layer, or an electroless Ni plated layer and an electroless Au plated layer in that order from a surface side of the electroless plated layer.

In the method of manufacturing a wiring board according to the present invention, a wiring board having a first terminal area which can be directly flip-chip connected to a solder bump of a semiconductor element can be provided. Thus, the wiring board according to the present invention can be directly flip-chip connected to a solder bump of a semiconductor element in an assured manner.

In the method of manufacturing a wiring board according to the present invention, the first electroplating step may include an Au plating and a Cu plating in that order; an Au plating and an Ni plating in that order; an Au plating, an Ni plating, and a Cu plating in that order; a Pd plating and a Cu plating in that order; a Pd plating and an Ni plating in that order; a Pd plating, an Ni plating, and a Cu plating in that order; a Pd alloy plating and a Cu plating in that order; a Pd alloy plating and an Ni plating in that order; a Pd alloy plating, an Ni plating, and a Cu plating or an Sn plating in that order; an Sn plating and Cu plating or an Sn alloy plating in that order; or an Sn alloy plating and a Cu plating in that order. The thus manufactured wiring board can be directly flip-chip connected to a solder bump of a semiconductor element at a surface of the first terminal area. Therefore, if the surface of the first terminal area is oxidized when bonded to the semiconductor element, it poses no problem in practical use.

Above all, when the first electroplating step includes an Au plating and a Cu plating in that order, an Au plating and an Ni plating in that order, or an Au plating, an Ni plating and a Cu plating in that order, the problem relating to a surface oxidation of the first terminal area can be solved in a more reliable manner.

In the method of manufacturing a wiring board according to the present invention, all the holes for forming bumps are so formed that their heights accord with a thickness of the first Cu layer. Thus, surfaces of the first terminal areas (bump portions) can be flush with a surface of the Ni layer or the Ti layer.

That is, since the first terminals can be uniformly formed, projected surfaces thereof can be flush with each other. In addition, the heights of the projections of the first terminal areas (bump portions), i.e., the heights of the first terminal areas projected from the resin material layer in a completed wiring board can accord with the thickness of the first Cu layer.

The first terminal area (bump portion) can be formed by electroplating, with the Ni layer or the Ti layer and the second Cu layer being used as conductive layers.

Herein, the Ni layer or the Ti layer serves as an etching stopper layer when the first Cu layer is etched, a base metal for the first electroplating, and a conductive layer therefor.

The second Cu layer functions as a support substrate, and a conductive layer for the first electroplating.

The resist used when etching the first Cu layer is a plating-proof resist, and therefore a workability can be enhanced.

In the method of manufacturing a wiring board according to the present invention, a surface of the first terminal area is subjected to an electroless Au plating, or an electroless Ni plating and an electroless Au plating in that order. The thus manufactured wiring board can be directly flip-chip connected to a solder bump of a semiconductor element at the surface of the first terminal area. When the wiring board is bonded to the semiconductor element, no problem relating to a surface oxidation of the first terminal area occurs.

In the method of manufacturing a wiring board according to the present invention, the first Cu layer and the Ni layer are etched and removed, so that parts remained by the etching are projected from the resin material layer. A surface of the projected part is subjected to an electroless plating to form a plated layer thereon. Thus, by determining a sum of the thicknesses of the first Cu layer and the Ni layer, the height of the part projected from the resin material layer can be adjusted. Since the projected surfaces of the first terminal areas can be flush with the surface of the Ni layer, the heights of the projections of the first terminal areas (bump portions), that is, the heights of the parts projected from the resin material layer in a completed wiring board can be adjusted such that the heights thereof can be flush with each other.

The second Cu layer can function not only as a support substrate, but also as a conductive layer when carrying out an electroplating. The second Cu layer forms a part of the first terminal area. By changing the thickness of the second Cu layer, the height of the projected part from the resin layer can be controlled, when a wiring board is manufactured.

The Ni layer serves as an etching stopper layer when the first Cu layer is etched, and a conductive layer when the electroplating is carried out. The second Cu layer functions as a support substrate.

The composite, which is formed by laminating the first Cu layer, the Ni layer or the Ti layer, and the second Cu layer in that order, is preferably made of a clad material in view of the productivity. However, a material of the composite is not limited thereto.

A clad material as the composite is fabricated in the following manner. First, the Ni plated layer is formed on a surface of a copper foil serving as the first Cu layer. Then, the Ni plated layer on the copper foil is thermo-compression bonded to a Cu foil serving as the second Cu layer. In this manner, the composite can be obtained.

Alternatively, the composite may be fabricated in the following manner. First, the Ni plated layer is formed on a surface of a copper foil serving as the first Cu layer or the second Cu layer. Then, a Cu plated layer serving as the second Cu layer or the first Cu layer is formed on the Ni plated layer. In this manner, the composite can be obtained.

The wiring layer may be formed by the semi-additive method, both a full-additive method and a subtractive method, or both the full-additive method and the semi-additive method.

As constituted above, the wiring board according to the present invention has a first terminal area which can be directly flip-chip connected to a solder bump of a semiconductor element. Thus, the wiring board according to the present invention can be directly flip-chip connected to a solder bump of a semiconductor element in an assured manner.

No solder resist is formed on a side where the first terminal area is formed, so that the resin material layer is exposed. Thus, there is no problem which may be caused by a shape of a terminal of a conventional wiring board having a solder resist thereon.

The electroplated layer of each of the first terminal areas may include, from a surface side of the electroplated layer, an Au plated layer and a Cu plated layer in that order; an Au plated layer and an Ni plated layer in that order; an Au plated layer, an Ni plated layer, and a Cu plated layer in that order; a Pd plated layer and a Cu plated layer in that order; a Pd plated layer and an Ni plated layer in that order; a Pd plated layer, an Ni plated layer, and a Cu plated layer in that order; a Pd alloy plated layer and a Cu plated layer in that order; a Pd alloy plated layer and an Ni plated layer in that order; a Pd alloy plated layer, an Ni plated layer, and a Cu plated layer or an Sn plated layer in that order; an Sn plated layer and Cu plated layer in that order; an Sn alloy plated layer or an Sn alloy plated layer and a Cu plated layer in that order. The electroless plated layer may include an electroless Au plated layer, or an electroless Ni plated layer and an electroless Au plated layer in that order. Therefore, if a surface of the first terminal area is oxidized, it poses no problem in practical use.

Above all, when an Au layer is formed on an outermost surface of the first terminal area, the surface oxidation of the first terminal area can be perfectly prevented.

BRIEF DESCRIPTION OF THE DRAWINGS

FIGS. 1(a) to 1(g) are cross-sectional views showing a part of steps in a first embodiment of a method of manufacturing a wiring board according to the present invention;

FIGS. 2(a) to 2(d) are cross-sectional views showing a part of steps succeeding the steps shown in FIGS. 1(a) to 1(g);

FIGS. 3(a) to 3(d) are cross-sectional views showing a part of steps succeeding the steps shown in FIGS. 2(a) to 2(d);

FIGS. 4(a) to 4(h) are cross-sectional views showing a part of steps in a second embodiment of a method of manufacturing a wiring board according to the present invention;

FIGS. 5(a) to 5(d) are cross-sectional views showing a part of steps succeeding the steps shown in FIGS. 4(a) to 4(h);

FIGS. 7(a) to 7(c) are cross-sectional views illustrating a wiring board having a flip connecting portion on a solder resist, and a bonding state of the wiring board and a semiconductor element.

DETAILED DESCRIPTION OF THE INVENTION

Embodiments of the present invention will be described below with reference to the drawings.

Figure 5:
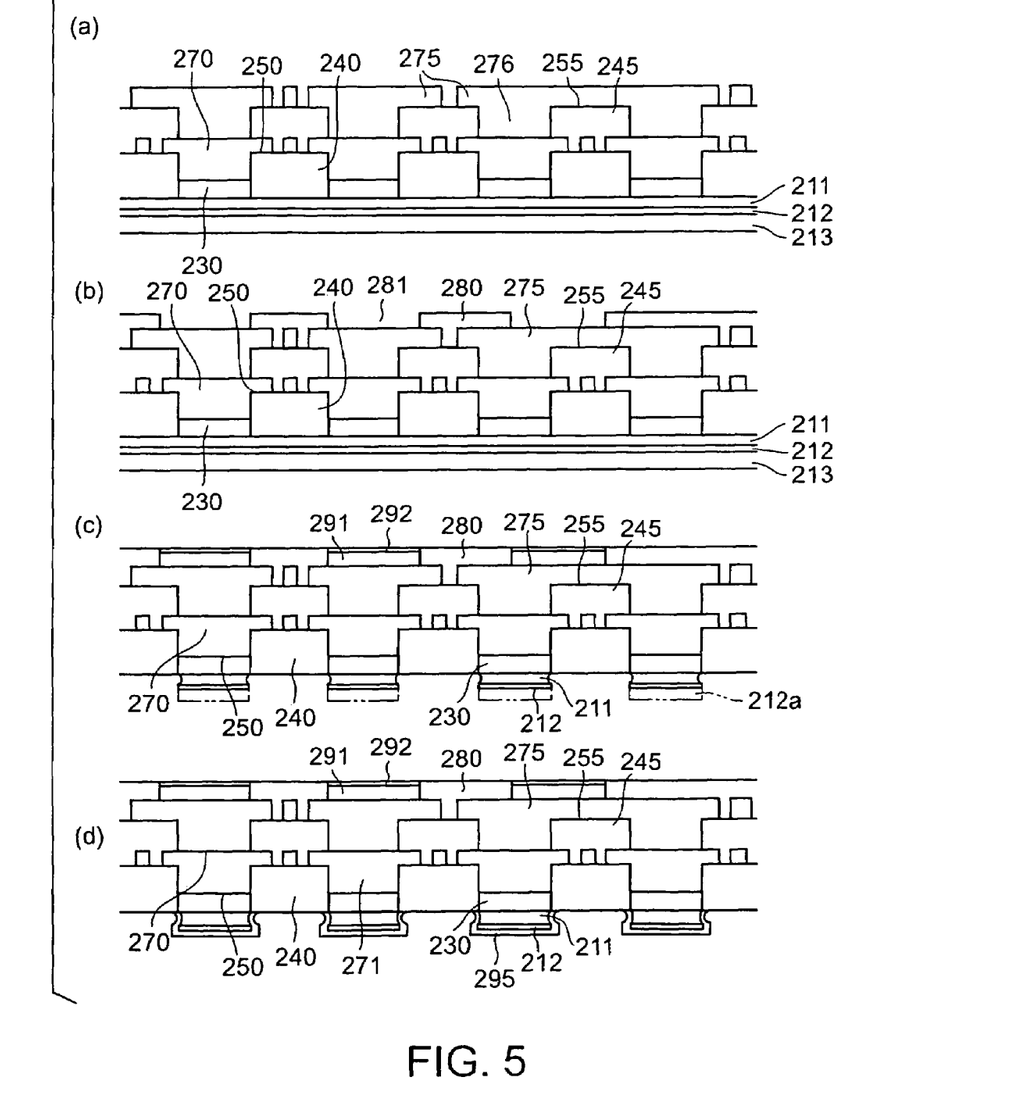
Figure 6:
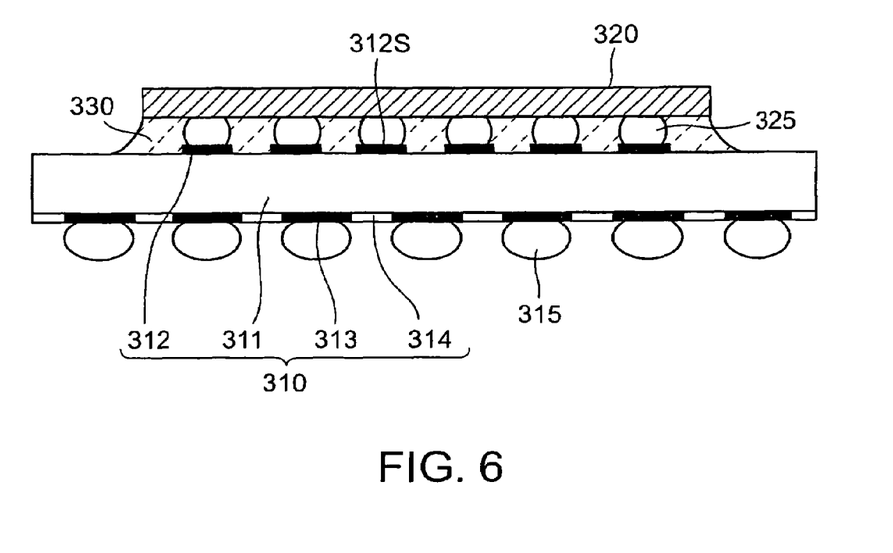
FIG. 6 is a cross-sectional view showing a package with a wiring board having bumps for flip-chip connection according to the present invention.

FIGS. 1(a) to 1(g) are cross-sectional views showing a part of steps in a first embodiment of a method of manufacturing a wiring board according to the present invention, FIGS. 2(a) to 2(d) are cross-sectional views showing a part of steps succeeding the steps shown in FIGS. 1(a) to 1(g), FIGS. 3(a) to 3(d) are cross-sectional views showing a part of steps succeeding the steps shown in FIGS. 2(a) to 2(d), FIGS. 4(a) to 4(h) are cross-sectional views showing a part of steps in a second embodiment of a method of manufacturing a wiring board according to the present invention, and FIGS. 5(a) to 5(d) are cross-sectional views showing a part of steps succeeding the steps shown in FIGS. 4(a) to 4(h). FIG. 3(d) is a cross-sectional view of the first embodiment of the wiring board having bumps for flip-chip connection according to the present invention, and FIG. 5(d) is a cross-sectional view of the second embodiment of the wiring board having bumps for flip-chip connection according to the present invention. FIG. 6 is a cross-sectional view showing a package with the wiring board having bumps for flip-chip connection according to the present invention. FIGS. 7(a) to 7(c) are cross-sectional views illustrating a wiring board having a flip connecting portion on a solder resist, and a bonding state of the wiring board and a semiconductor element.

In FIGS. 1 to 7, the reference number 110 depicts a (plate-like) composite, 111 depicts a first Cu layer, 111A depicts a hole, 112 depicts an Ni layer, 113 depicts a second Cu layer, 120 depicts a resist, 121 depicts an opening of the resist, 131 depicts an Au plated layer, 132 depicts an Ni plated layer, 133 depicts a Cu plated layer, 140 depicts a resin material layer, 141 depicts a hole (hole for forming a via), 145 depicts a resin material layer, 150 and 155 depict an electroless Cu plated layer (also referred to simply as "Cu layer"), 160 depicts a resist, 170 depicts a Cu layer, 171 depicts a via part, 175 depicts a Cu layer, 176 depicts a via part, 180 depicts a solder resist, 181 depicts an opening, 191 depicts an Ni plated layer, 192 depicts a gold plated layer, 210 depicts a (plate-like) composite, 211 depicts a first Cu layer, 212 depicts an Ni layer, 213 depicts a second Cu layer, 220 depicts a resist, 221 depicts an opening of the resist, 230 depicts an electroplated layer (also referred to as "electroplated portion"), 240 depicts a resin material layer, 241 depicts a hole (hole for forming a via), 245 depicts a resin material layer, 250 and 255 depict an electroless plated layer, 260 depicts a resist, 270 depicts a Cu layer, 271 depicts a via part, 275 depicts a Cu layer, 276 depicts a via part, 280 depicts a solder resist, 281 depicts an opening, 291 depicts an Ni plated layer, 292 depicts a gold plated layer, 310 depicts a wiring board (having bumps for flip-chip connection), 311 depicts a wiring layer laminated part (also referred to as "wiring part"), 312 depicts a terminal for flip-chip connection (also referred to as "first terminal area"), 312S depicts a projected flat portion, 313 depicts a terminal to be connected to a mother board (also referred to as "second terminal area"), 314 depicts resin material layers, 315 depicts a solder ball, 320 depicts a semiconductor element, 325 depicts a solder bump, 330 depicts an underfill, 710 depicts a semiconductor element, 715 depicts a solder bump, 720 depicts a wiring board (also referred to as "interposer"), 721 depicts a terminal area, 725 depicts a solder bump, and 730 depicts a bonding part.

A first embodiment of a method of manufacturing a wiring board according to the present invention is described with reference to FIGS. 1 to 3.

As shown in FIG. 3(d), a wiring board includes a wiring part formed of two wiring layers 170 and 175, first terminal areas 131, 132, and 133 disposed on one side of the wiring layers 170 and 175 in a projecting manner, and second terminal areas 191 and 192 disposed on the other side of the wiring layers 170 and 175.

The wiring layers 170 and 175 of the wiring part respectively have resin material layers 140 and 145 on a side where the first terminal areas 131, 132, and 133 are formed. The first terminal areas 131, 132, and 133 constitute a projected bump for flip-chip connection to be directly flip-chip connected to a solder bump of a semiconductor element. The second terminal areas 191 and 192 are formed such that an opening 181 of a solder resist 180 covering the wiring layers 170 and 175 is filled with the second terminal areas 191 and 192.

The wiring layers 170 and 175 are oriented such that their sides where the resin material layers 140 and 145 are formed, face the first terminal areas 131, 132, and 133.

No solder resist is disposed on a side where the first terminal areas 131, 132, and 133 are formed, so that the resin material layer 140 is exposed outside. The first terminal areas 131, 132, and 133 are disposed such that the flat portion 131 is positioned at a projected end. The flat portions 131 of the first terminal areas 131, 132, and 133 are flush with each other. The wiring board as constituted above is used as an interposer for a package.

A method of manufacturing the wiring board is described below. First, a plate-like composite 110 having a first Cu layer 111, an Ni layer 112, and a second Cu layer 113, which are laminated in that order, is prepared (FIG. 1(a)). Then, a resist 120 of a predetermined shape is formed on a surface of the first Cu layer 111 (FIG. 1(b)). A part of the first Cu layer 111 exposed from an opening 121 of the resist 120 is etched to form a predetermined region, so that a hole 111A for a first terminal area forming region is formed (FIG. 1(c)).

Although the composite 110 is preferably made of a clad material in view of the productivity, a material of the composite 110 is not limited thereto.

In general, a thickness of the first Cu layer is 50 µm to 125 µm, a thickness of the Ni layer 112 is 1 µm, and a thickness of the second Cu layer 113 is 18 µm to 30 µm.

A clad material as the composite 110 may be fabricated in the following manner. The Ni plated layer 112 is formed on a surface of a copper foil serving as the first Cu layer 111 or the second Cu layer 113. Then, the Ni plated layer 112 on the copper foil is thermo-compression bonded to a Cu foil serving as the second Cu layer 113 or the first Cu layer 111. In this manner, the composite 110 can be obtained.

Alternatively, the composite 110 may be fabricated in the following manner. The Ni plated layer 112 is formed on a surface of a Cu foil serving as the first Cu layer 111 or the second Cu layer 113. Then, the Cu plated layer 113 or 111 serving as the second Cu layer or the first Cu layer is formed on the Ni plated layer 112. In this manner, the composite 110 can be also obtained.

The resist 120 should be capable of resisting the following plating steps.

The resist 120 is generally made of acryl.

Since the Ni layer 112 is used as an etching stopper layer, an alkali etchant, which does not etch the Ni layer 112, is used for etching the first Cu layer 111.

Next, the first terminal areas 131, 132, and 133 as a bump for flip-chip connection are formed by electroplating, with the resist 120 being used as a plating-proof resist, such that the hole 111A formed in the etching step is filled with the first terminal areas 131, 132, and 133 (FIG. 1(d)).

In this embodiment, the hole 111A is subjected to an Au plating, an Ni plating, and a Cu plating in that order, to form an Au plated layer 131, an Ni plated layer 132, and a Cu plated layer 133 in that order, so as to fill the hole 111A.

The Au plated layer 131, the Ni plated layer 132, and the Cu plated layer 133 form the first terminal areas 131, 132, and 133.

In place of the above plating steps, the hole 111A may be subjected to an Au plating and a Cu plating in that order, or an Au plating and an Ni plating in that order.

Thereafter, the resist 120 is removed from the composite 110 (FIG. 1(e)). Then, the wiring layer 170 with wirings as a first layer is formed on a side where the first terminal areas 131, 132, and 133 of the composite 110 are formed, through the resin material layer 140 by a semi-additive method, such that the wiring layer 170 is connected to the first terminal areas 131, 132, and 133 in the following manner.

First, the resin material layer 140 formed of an insulating resin is laminated on the side where the first terminal areas of the composite 110 are formed (FIG. 1(f)). Then, a hole 141 for forming a via is opened in the laminated resin material layer 140 by using a laser (FIG. 1(g)).

Although the resin material layer 140 is preferably formed of aramid fibers or glass fibers impregnated with an epoxy resin, a material of the resin material layer 140 is not limited thereto.

The resin material layer 140 is laminated in the following manner. For example, the resin material layer 140 is formed on a surface of a copper foil. The copper foil with the resin material layer 140 is then laminated on the composite 110 with the resin material layer 140 facing the composite 110. Thereafter, the copper foil is removed from the composite 110.

A $CO_2$ laser or a UV-YAG laser is used for forming the hole 141.

Next, a surface of the resin material layer 140 including a surface of the hole 141 is subjected to an electroless Cu plating so as to form thereon an electroless Cu plated layer 150 (FIG. 2(a)). A resist 160 having an opening for a circuit forming part is formed on the electroless Cu plated layer 150 (FIG. 2(b)). Then, a part of the Cu layer 150 exposed from the opening of the resist 160 is subjected to an electroplated Cu plating, with the Cu layer 150 being used as a conductive layer, so that an electroplated Cu plated layer 170 is formed on the electroless Cu plated layer 150 (FIG. 2(c)). Then, the resist 160 is removed from the electro Cu plated layer, and the exposed electroless plated Cu layer 150 is etched and removed. Thus, a circuit part is formed (FIG. 2(d)).

In this way, the wiring layer 170 as a first layer is formed.

Similarly to the above, the wiring layer 175 as a second layer is formed on the wiring layer 170 as a first layer (FIG. 3(a)).

Then, a solder resist 180, which has an opening 181 for exposing a region where the second terminals 191 and 192 are formed, is formed on the wiring layer 175 as a second layer, such that the wiring layer 175 is covered with the solder resist 180 (FIG. 3(b)).

The opening 181 of the solder resist 180 is subjected to an electroplating so as to form the second terminal areas 191 and 192 (FIG. 3(c)).

The electroplating step includes an electro Ni plating and an electro Au plating in that order, with the Ni layer 111 and the second Cu layer 113 functioning as conductive layers.

A sum of thicknesses of the Ni plated layer 191 and the Au plated layer 192 corresponds to a thickness of the solder resist 180.

Thereafter, remaining parts of the composite 110 are etched and removed (FIG. 3(d)), by etching the second Cu layer 113, the Ni layer 112, and the first Cu layer 111 in that order.

In the etching and removing step, the second Cu layer 113 and the first Cu layer 111 are etched by means of, e.g., an alkali etchant, and the Ni layer 112 is etched by means of, e.g., peroxide water or a solution of sulfuric acid as an etchant.

Finally, the desired wiring board is completed (FIG. 3(d)).

Figure 4:
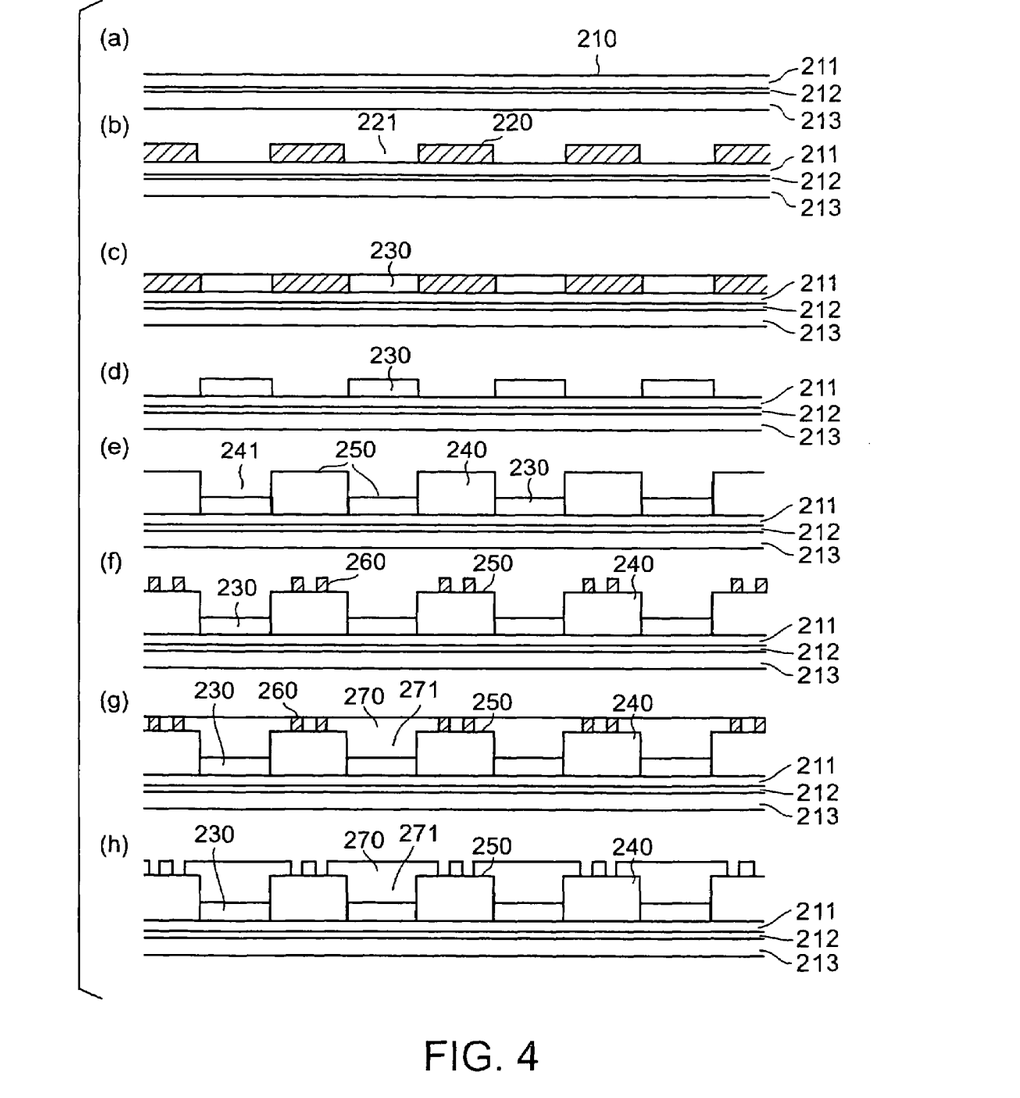

A second embodiment of a method of manufacturing a wiring board according to the present invention is described with reference to FIGS. 4 and 5.

A wiring board includes a wiring part formed of two wiring layers 270 and 275, first terminal areas 230, 211, 212, and 295 disposed on one side of the wiring layers 270 and 275 in a projecting manner, and second terminal areas 291 and 292 disposed on the other side of the wiring layers 270 and 275 (FIG. 5(d)).

The wiring layers 270 and 275 of the wiring part respectively have resin material layers 240 and 245 on a side where the first terminal areas 230, 211, 212, and 295 are formed. The first terminal areas 230, 211, 212, and 295 constitute a projected bump for flip-chip connection to be directly flip-chip connected to a solder bump of a semiconductor element. The second terminal areas 291 and 292 are formed such that an opening 281 of a solder resist 280 covering the wiring layers 270 and 275 is filled with the second terminal areas 291 and 292.

The wiring layers 270 and 275 are oriented such that their sides where the resin material layers 240 and 245 are formed, face the first terminal areas 211, 212, and 295. No solder resist is disposed on a side where the first terminal areas 230, 211, 212, and 295 are formed, so that the resin material layer 240 is exposed outside. The first terminal areas 211, 212, and 295 are disposed such that the flat portion 295 is positioned at a projected end. The flat portions 295 of the first terminal areas 211, 212, and 295 are flush with each other.

The wiring board as constituted above is used as an interposer for a package.

A method of manufacturing the wiring board is described below. First, a plate-like composite 210 having a first Cu layer 211, an Ni layer 212, and a second Cu layer 213, which are laminated in that order, is prepared (FIG. 4(a)). Then, a resist 220 of a predetermined shape is formed on a surface of the first Cu layer 211 (FIG. 4(b)). A part of the first Cu layer 221 exposed from an opening 221 of the resist 220 is electroplated, with the resist 220 being used as a plating-proof resist, so that an electroplated portion 230 as a part of the first terminal areas is formed to fill the opening 221 (FIG. 4(c)).

The electroplated portion 230 is generally a Cu plated portion.

Next, the resist 220 is removed from the composite 210 (FIG. 4(d)). Thereafter, the wiring layer 270 as a first layer is formed on a side where the electroplated portion 230 is formed through the resin material layer 240, such that the wiring layer 270 is connected to the electroplated portion 230 as a part of the first terminal areas (FIGS. 4(e) to 4(h)). Then, the wiring layer 275 as a second layer is formed on the side where the electroplated portion 230 is formed through the resin material layer 245 (FIG. 5(a)). A solder resist 280, which has an opening 281 for exposing a region where the second terminal areas 291 and 292 are formed, is formed to cover the whole wiring layer 275 (FIG. 5(b)).

The opening 281 of the solder resist 280 is subjected to an electroplating to form the second terminal areas including the Ni plated layer 291 and the Au plated layer 292.

Then, the second Cu layer 213 is etched and removed, with the Ni layer 212 being used as an etching stopper layer. An additional resist 212a is formed on the Ni layer 212 to cover only the first terminal areas. The exposed Ni layer 212 and the first Cu layer 211 are etched and removed, with the additional resist 212a being used as an etching-proof resist. The first terminal areas are thus formed by the electroplated portion 230, a remaining part of the first Cu layer 211, and a remaining part of the Ni layer 212, and subsequently the additional resist 212a is removed from the Ni layer 212 (FIG. 5 (c)).

An exposed surface of the Ni layer 212 is subjected to an electroless Au plating to form an electroless Au plated layer 295 (FIG. 5(d)).

Finally, the desired wiring board is completed.

In the second embodiment, since the same members as those of the first embodiment can be used, their description is omitted.

A modification of the present invention is described below. In place of the plate-like composite 110 formed by laminating the first Cu layer 111, the Ni layer 112, and the second Cu layer 113 (FIG. 1(a)), a plate-like composite formed by laminating a first Cu layer, a Ti layer, and a second Cu layer may be used.

In FIGS. 1 to 3, and 4 and 5, the number of the wiring layer may be one, or more than two.

A method of forming the wiring layer is not limited to the semi-additive method.

Both a full-additive method and a subtractive method, or both the full-additive method and the semi-additive method can be utilized.

FIG. 3(d) shows a wiring board having bumps for flip-chip connection which is manufactured by the first embodiment of a method of manufacturing a wiring board according to the present invention, and FIG. 5(d) shows a wiring board having bumps for flip-chip connection which is manufactured by the second embodiment of a method of manufacturing a wiring board according to the present invention. However, the present invention is not limited to the above embodiments.

Each of the wiring boards shown in FIGS. 3(d) and 5(d), projected bumps for a flip-chip connection as first terminal areas are formed on one side of a wiring board having two wiring layers. The bumps are directly flip-chip connected to solder bumps of a semiconductor element. Second terminal areas are formed on the other side of the wiring board by plating, such that openings of a solder resist covering a wiring part is filled with the second terminal areas. The respective wiring layers with wirings on resin material layers are oriented such that their sides where the resin material layers are formed, face the first terminal areas, while their wirings face the second terminal areas. No solder resist is disposed on a side where the first terminal areas are formed, so that the resin material layer is exposed. Each of the first terminal areas has a flat portion at a projected end thereof. The flat portions of the respective first terminal areas are flush with each other. A surface plated layer formed of an electroplated layer or an electroless plated layer is formed on all the exposed surface of the first terminal areas including side surfaces thereof.

An explanation of materials of the respective members is included in above the description of the manufacturing method, and such an explanation is omitted herein.

FIG. 6 shows a package using a wiring board 310 as an interposer shown in FIG. 3(d) or 5(d). The wiring board 310 has first terminal areas 312 which are directly flip-chip connected to solder bumps 325 of a semiconductor element 320.

Since projected flat portions 312S of each of the first terminal areas 312 are flush with each other, the wiring board 310 and the semiconductor element 320 can be uniformly bonded to each other.

In addition, since a surface of each of the first terminal areas 312 is a metal layer, the surface of the first terminal area 312 is chemically stable and is not oxidized. Thus, a flux treatment may be omitted.

As described above, the wiring board according to the present invention has plated bumps or bumps each having a plated surface, which can be directly flip-chip connected to solder bumps of a semiconductor element. Accordingly, the wiring board can be directly flip-chip connected to solder bumps of a semiconductor element in a highly reliable manner.

To be specific, a solder bump, which is formed of a more expensive material by a more complicated process is no more needed. A bump corresponding to a smaller pitch can be realized by a reduced cost.

Figure 1:
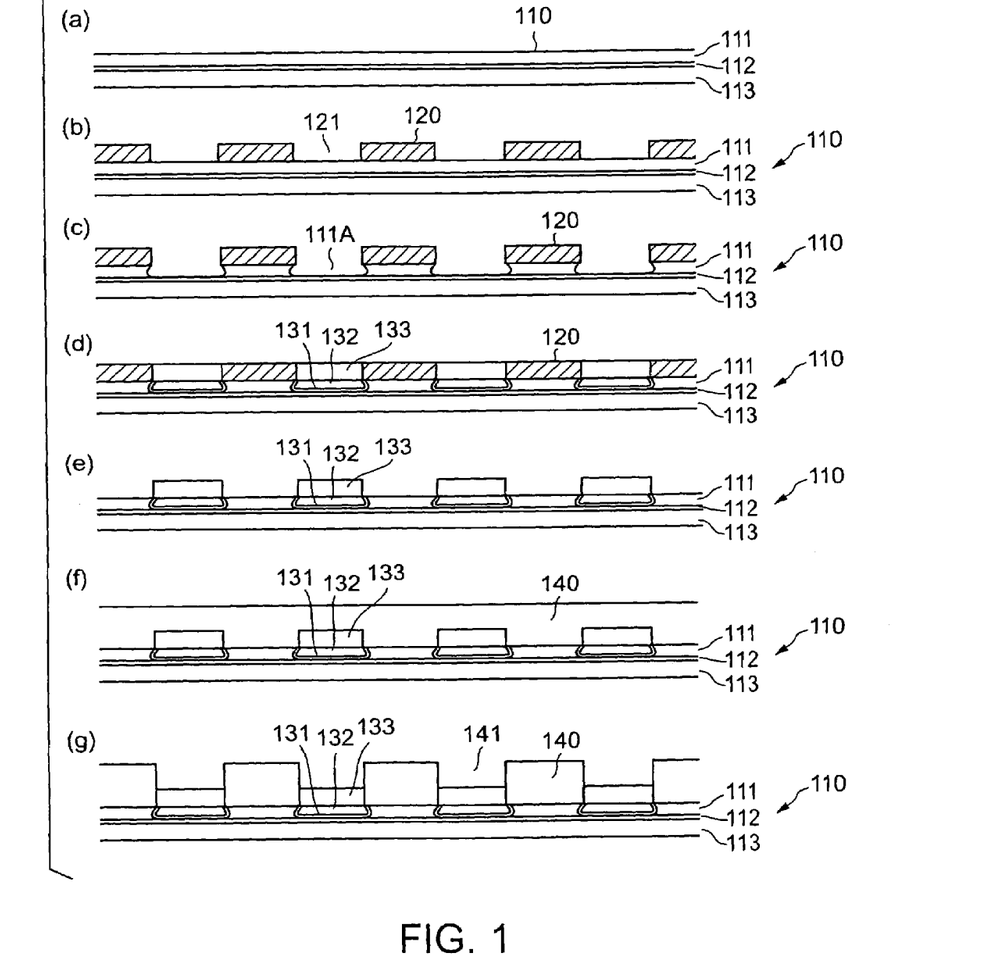
Figure 2:
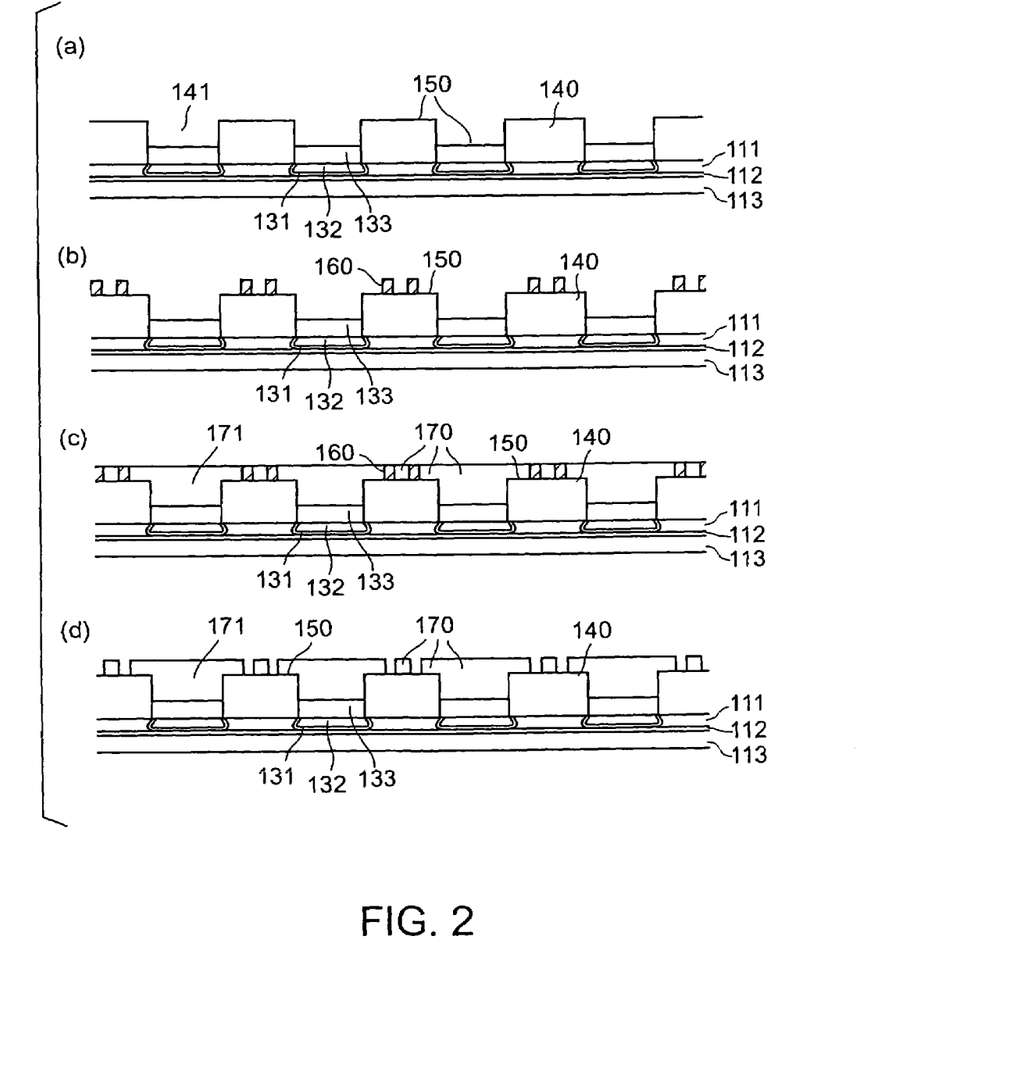
Figure 3:
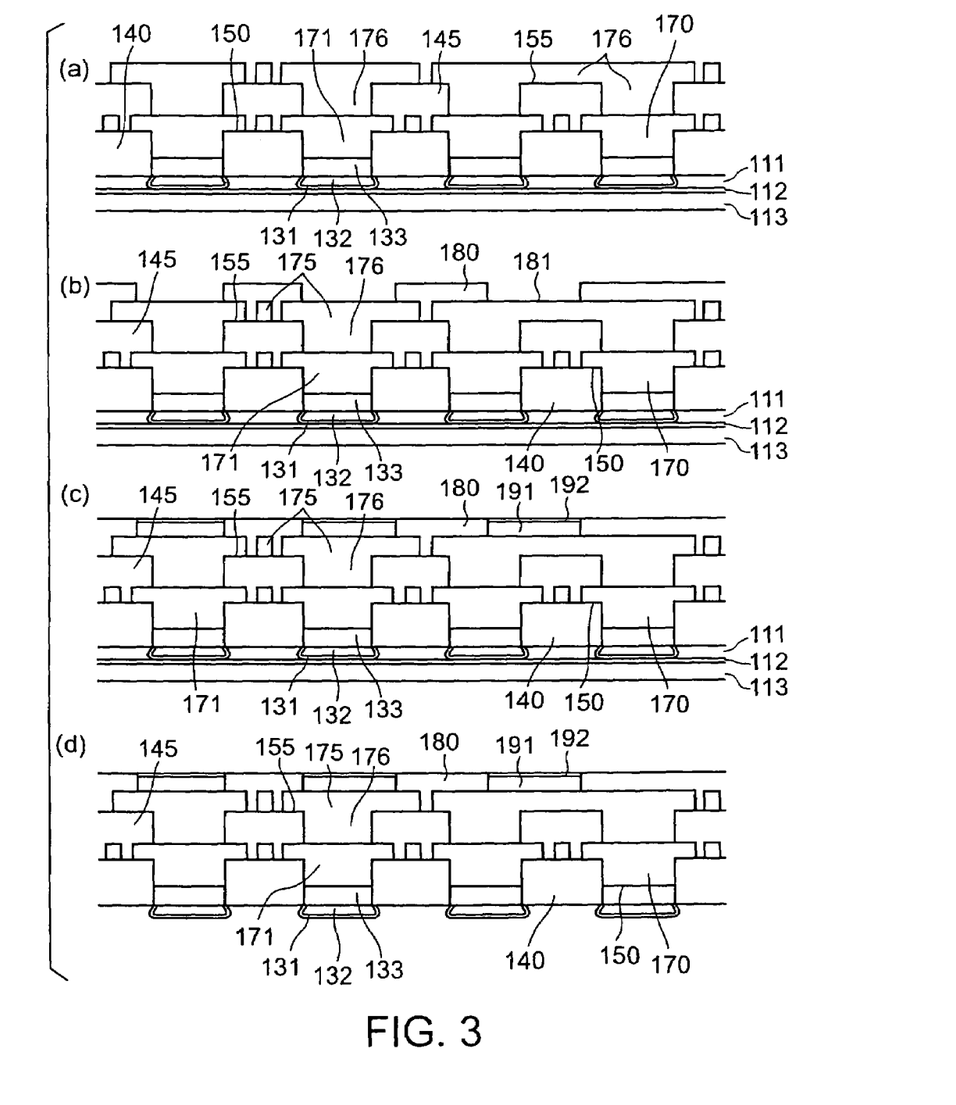

In the method of manufacturing a wiring board shown in FIGS. 1 and 3, a bump can be formed by an electroplating with a higher reliability in bonding, in place of an electroless Ni plating and an electroless Au plating.

As compared with solder bumps formed by printing, the bumps according to the present invention can be formed to have more uniform heights. Accordingly, the solder bumps according to the present invention can be well bonded to a semiconductor element, which results in an improvement of a yield ratio in packaging.

When a Pb free solder is used, it is unnecessary to heat a wiring board. Therefore, the wiring board is less damaged, so that a yield ratio can be improved.

What is claimed is:

1. A wiring board comprising:
    a wiring part formed of one or more wiring layers;
    a plurality of first terminal areas disposed on one side of the wiring part; and a plurality of second terminal areas disposed on the other side of the wiring part; wherein
    the wiring layer has a resin material layer facing on a side of the first terminal areas, the resin material layer being exposed because no solder resist is disposed on the wiring part on the side of the first terminal areas;

the first terminal areas respectively have flat portions at their end, the flat portions being flush with each other.

2. The wiring board according to claim 1, wherein the electroplated layer of each of the first terminal areas includes one of, from a surface side of the electroplated layer, an Au plated layer and a Cu plated layer in that order; an Au plated layer and an Ni plated layer in that order; an Au plated layer, an Ni plated layer, and a Cu plated layer in that order; a Pd plated layer and a Cu plated layer in that order; a Pd plated layer and an Ni plated layer in that order; a Pd plated layer, an Ni plated layer, and a Cu plated layer in that order; a Pd alloy plated layer and a Cu plated layer in that order; a Pd alloy plated layer and an Ni plated layer in that order; a Pd alloy plated layer, an Ni plated layer, and a Cu plated layer or an Sn plated layer in that order; an Sn plated layer and Cu plated layer in that order; an Sn alloy plated layer or an Sn alloy plated layer and a Cu plated layer in that order.

3. The wiring board according to claim 1, wherein the electroless plated layer of each of the first terminal areas includes an electroless Au plated layer, or an electroless Ni plated layer and an electroless Au plated layer in that order from a surface side of the electroless plated layer.

* * * * *